Sept. 1, 1970 J. V. STOVER 3,526,787

COMPLEMENTARY TRANSISTOR PAIR SWITCHING CIRCUIT

Filed Nov. 17, 1966 4 Sheets-Sheet 1

INVENTOR.
JOE V. STOVER,
BY
Thomas R. Boston
ATTORNEY

United States Patent Office 3,526,787
Patented Sept. 1, 1970

3,526,787
COMPLEMENTARY TRANSISTOR PAIR SWITCHING CIRCUIT

Joe V. Stover, Fullerton, Calif., assignor to Hughes Aircraft Company, Culver City, Calif., a corporation of Delaware Filed Nov. 17, 1966, Ser. No. 595,083
Int. Cl. H03k 17/02
U.S. Cl. 307—254 6 Claims

ABSTRACT OF THE DISCLOSURE

The switching circuit includes at least one main current-carrying transistor for connection to the power supply on a load. The base of the main transistor is connected to a complementary pair of transistors which comprise the main transistor control stage. The control stage is bistable and changes state upon application of appropriate pulses from a pulse source.

BACKGROUND

This invention relates to switching circuitry and, more particularly to a high power transistor switching circuit.

In an application by this inventor for a Pulse Modulator with Transistor Switch, filed Jan. 14, 1963, Ser. No. 251,443, now U.S. Pat. No. 3,184,615, there is described and claimed a transistor switching apparatus for controlling the flow of current or power between a source and a load. Basically, the emitter and collector of a transistor are connected across the source and the load which are connected in series. A novel control circuit is connected across the base and collector of the transistor to control its state of conduction and thereby control the flow of current through it from the source to the load. Hereafter, the transistor will be generally referred to as the main current carrying transistor, since its function is to control the supply of the current to the load.

Briefly, the control circuit includes a control transistor, a diode network which includes an avalanche type or four layer diode, a first coupling network to supply an ON trigger pulse, and a second coupling network to supply an OFF trigger pulse. The ON trigger pulse increases the voltage across the avalanche diode to a level sufficient to switch the diode to conduction. This in turn enables current to flow in the base of the main current carrying transistor driving it to near saturation and thereby enable current from the source to flow through the transistor to the load. On the other hand, during the duration of the OFF trigger pulse, the control transistor is switched to a conductive state, returning the avalanche diode to its nonconductive state, so that at the end of the OFF trigger pulse, both the control and main current carrying transistors return to their nonconductive states. As a result, current ceases to flow through the main current carrying transistor from the source to the load.

The switching circuit described and claimed in the aforementioned U.S. patent has been found to be most useful when one or only a few main current carrying transistors are sufficient to control the flow of current to a load, since each transistor requires separate ON and OFF trigger pulse coupling networks. However, in situations where due to very large load currents, several serially connected switching main current carrying transistors are needed to control the currents, the need of two coupling networks with each transistor becomes too complex and costly, which limits the use of the apparatus in such applications. Also, it has been found that care must be exercised in selecting the avalanche diode since the diode's reliability directly affects the reliability of the switching apparatus.

It is a primary object of the present invention to provide a new transistor switching circuit.

Another object is the provision of a new transistor switching circuit which does not include avalanche type diodes.

A further object is to provide a transistor switching circuit which requires a minimum number of coupling networks, necessary to provide the circuit with trigger pulses.

Still another object is a transistor switching circuit incorporating a plurality of main current carrying transistors which are controllable by trigger pulses, supplied through a minimum number of coupling networks.

Still a further object is the provision of a new transistor switching circuit which includes a plurality of serially connected main current carrying transistors, all of which are controlled by a control network which includes one coupling network through which an ON pulse is supplied to the control network and one coupling network through which an OFF pulse is supplied to the network.

These and other objects of the invention are achieved by providing a transistor switching circuit which includes at least one main current carrying transistor, controlled by at least two complementary transistors which define a transistor control stage. The stage is operated in either a conductive or nonconductive state. The state of conduction of the transistor control stage controls the state of the conduction of the main current carrying transistor which in turn controls the flow of current from a source to a load across which the main current carrying transistor is connected. Briefly, each transistor control stage includes two complementary transistors, one a PNP and the other an NPN, with the base and collector of one transistor connected respectively to the collector and base of the other to form a regenerative closed loop. When the product of the current gains of the two transistors is equal to or greater than unity, the two transistors are driven to conduction and remain in a conductive state until the product of the current gains is caused to drop below unity, causing the transistors to be switched to a nonconductive state. Conduction is initiated by providing the stage with an ON pulse having a polarity and amplitude which are sufficient to increase the product of the current gains of the two transistors to unity or above, while the stage is switchable to a nonconductive state by an OFF pulse, which briefly reduces the product of the current gains to below unity. Hereafter, for explanatory purposes only, the product of the current gains of the two transistors in each stage will also be referred to as the current gain product of the stage.

The transistor control stage is connected across the base and collector of the main current carrying transistor so that when the stage is in a conductive state, the resistance between the base and collector of the transistor is very small, switching the transistor to conduction or to an ON state so that current from the source flows therethrough to the load. On the other hand, when the transistor stage is in a nonconductive or OFF state, the base to collector resistance of the main current carrying transistor is high. The transistor is in a nonconductive or OFF state and thereby blocks the current from flowing therethrough.

A plurality of transistor stages, each with a pair of complementary transistors, may be serially connected across the base to collector of a single main current carrying transistor. A single ON pulse is required to switch all the stages to their ON state and thereby switch the main current carrying transistor to an ON state, while a single OFF pulse is required to switch them to the OFF state. When the transistor switching circuit includes a plurality of main current carrying transistors, serially connected between the source of current and the current load, each of these transistors is connected across a different one or more of the serially connected transistor control stages so that by applying a single pulse, all the main current carrying transistors may be switched to either an ON or an OFF state and thereby control the flow of current therethrough.

The novel features that are considered characteristic of this invention are set forth with particularity in the appended claims. The invention will best be understood from the following description when read in connection with the accompanying drawings.

DESCRIPTION

Figure 1:
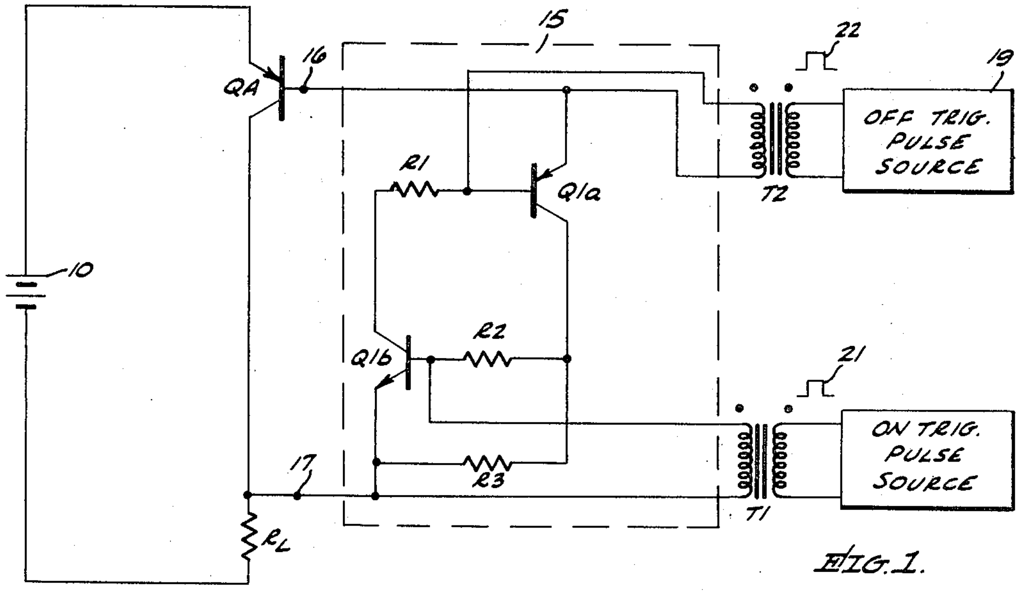
FIG. 1 is a basic schematic diagram of the transistor switching circuit of the invention.

Attention is now directed to FIG. 1 which is a simplified diagram, useful in explaining the principles of operation of the present invention. Therein, a regulated power source represented by a battery 10 is shown connected to a load, represented by a resistor $R_L$ through a main current carrying transistor QA. The transistor QA, shown to be of the PNP type, has the emitter thereof connected to the positive terminal of source 10, while the collector thereof is connected to the load $R_L$. A control stage, generally designated by numeral 15, is shown connected to the base and collector of transistor QA at terminals 16 and 17 thereof. The control stage 15 is also shown coupled to an ON trigger pulse source 18 through a transformer T1 and to an OFF trigger pulse 19, through a transformer T2.

Upon the receipt of an ON trigger pulse, or simply an ON pulse, from source 18, control stage 15 provides a low resistance between terminals 16 and 17, across the base and collector of transistor QA so that the transistor is switched to an ON state to enable collector current to flow to the load $R_L$ from source 10. On the other hand, an OFF trigger pulse, or simply an OFF pulse, from source 19, controls stage 15 to provide a high resistance between terminals 16 and 17, switching transistor QA to a nonconductive or OFF state, and thereby disrupting the flow of current therethrough from source 10 to the load $R_L$.

Up to this point in the description, the circuit shown in FIG. 1 operates in a manner identical with that of the switching circuit described and claimed in the aforementioned U.S. patent. However, whereas in the circuit shown in the U.S. patent the control stage includes a control transistor and a diode network including an avalanche diode, in accordance with the teachings of the present invention the control stage consists of a pair of complementary transistors, designated in FIG. 1 as Q1*a* and Q1*b*. Transistor Q1*a* is of the PNP type, while transistor Q1*b* is of the NPN type. The base of Q1*a* is connected to the collector of Q1*b*, through a resistor R1, while the base of Q1*b* is connected to the collector of Q1*a* through another resistor R2. Source 18 is shown connected to the primary winding of coupling transformer T1, having the secondary winding connected across the base and the emitter of Q1*b*. Similarly, OFF trigger pulse source 19 is connected to the primary winding of coupling transformer T2, having its secondary winding connected across the emitter and base of PNP transistor Q1*a*. The winding polarities of the two transformers are indicated by the conventional dots.

In operation, in order to provide a low resistance between terminals 16 and 17, and thereby switch transistor QA to a conductive state to enable current from source 10 to flow to the load $R_L$, transistors Q1*a* and Q1*b* are driven to their conductive states. The two transistors form a two transistor complementary pair in which the base and collector of one of the transistors, such as Q1*a*, are tied to the collector and base of transistor Q1*b*, respectively, thereby forming a regenerative closed loop. When the product of the current gains of the two transistors becomes equal to or greater than unity, an unstable condition exists which tends to drive both transistors to conduction. The product of the current gains may be represented by the expression $\beta_a\beta_b$, where $\beta_a$ and $\beta_b$ represent the forward current gain of Q1*a* and Q1*b*, respectively.

Since the forward current gain of each transistor is current dependent, initiation of the condition where the current gains product is equal to or greater than unity may be accomplished by momentarily increasing the forward current gain of either of the transistors. This may be accomplished by providing an ON trigger pulse 21 from source 18 having a polarity which induces a pulse in the secondary winding of transformer T1 so as to drive current into the base of transistor Q1*b* to cause collector current to flow therein. Once the current gain product $(\beta_a\beta_b)$ is equal to or greater than one, the ON trigger pulse is no longer necessary, since the regenerative closed loop characteristics of the transistor pair will maintain the transistors in their conductive state. As long as the two transistors are conducting, a low resistance is present across terminals 16 and 17 to which the base and collector of transistor QA are connected. Thus, the latter mentioned transistor is switched to an ON state to enable current to flow from source 10 to load $R_L$.

To terminate the supply of current to the load, transistor QA is switched back to its nonconductive or OFF state, by providing a relatively large resistance between the base and collector thereof at terminals 16 and 17. This is accomplished by switching the transistors Q1*a* and Q1*b* in control stage 15 to their nonconductive state. The switching is accomplished by momentarily reducing the current gain product thereof $(\beta_a\beta_b)$ to be less than unity. The reduction of the current gain product may be accomplished by supplying an OFF trigger pulse 22 from source 19 to the primary winding of coupling transformer T2. As a result, a related pulse is induced in the secondary winding which drives current into the base of PNP transistor Q1*a* and thereby momentarily reduces the current gain thereof, which in turn reduces the current gain product of the two transistors to be less than unity. When this happens, the two transistors revert back to their nonconductive states, resulting in an increase in the resistance across terminals 16 and 17 which in turn switches transistor QA to a nonconductive state and disrupts the supply of current to the load $R_L$ from the power source 10.

Figure 2:
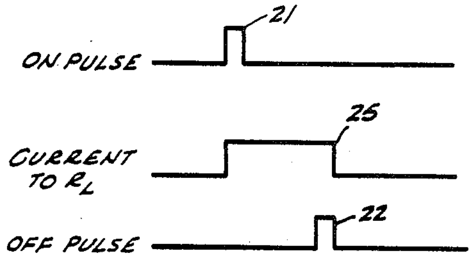
FIG. 2 is a simplified waveform diagram useful in explaining the operation of the circuit in FIG. 1.

Reference is now made to FIG. 2 in which waveforms illustrating the relationship between the ON trigger pulse 21, the OFF trigger pulse 22, and the current supplied to the load $R_L$ are illustrated. Numeral 25 represents a current pulse, supplied to load $R_L$, having a leading edge which is related in time to the ON pulse 21, and a trailing edge which is related in time to the occurrence of the OFF trigger pulse 22, hereinbefore described. Thus, it should be appreciated that by controlling the supply of ON and OFF trigger pulses to control stage 15, the current pulses supplied to the load $R_L$ through transistor QA may be controlled.

Figure 3:
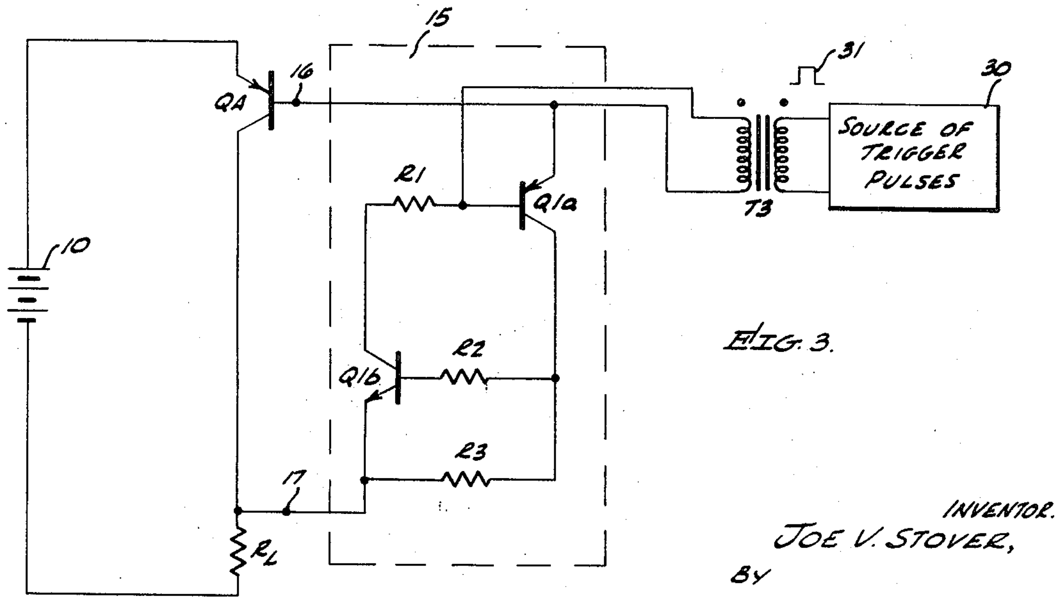
FIG. 3 is a schematic diagram of another embodiment of the invention, similar to that shown in FIG. 1.

In FIG. 1, separate sources are shown for the ON trigger pulse and the OFF trigger pulse, which are coupled by means of separate coupling networks or transformers to the two transistors forming the complementary pair, i.e. transistors Q1*b* and Q1*a*. However, it should be appreciated that since the function of the trigger pulses is to either momentarily increase the total current gain of the two transistors to be equal to or greater than unity and thereby cause the two transistors to switch into conduction or as in the OFF state, reduce the current gain product to below unity so that the two transistors are switched to an OFF state, a single coupling network may be employed to couple the base and emitter of one of the two transistors, such as transistor Q1*a*, to an appropriate source of control pulses. Then, depending on the polarity or the pulses from such source, the forward current gain of the transistor Q1*a* can be increased, to result in a total current gain product of unity or greater, and thereby switch the two transistors to a conductive state, or decrease the current gain of transistor Q1*a* sufficiently so that the product of the current agins of Q1*a* and Q1*b* is below unity and thereby cause the two transistors to switch to an OFF state. Such an arrangement is diagrammed in FIG. 3 to which reference is made herein. In FIG. 3, elements like those shown in FIG. 1 are designated by like numerals. In FIG. 3, instead of including sources 18 and 19 (FIG. 1), a single source of control pulses 30 is shown coupled, through a coupling transformer T3, to the emitter and base of transistor Q1*a*. In FIG. 3, numeral 31 represents an ON trigger pulse, while numeral 32 represents an OFF trigger pulse. Both pulses are supplied from the source 30, but are of opposite polarities.

Summarizing the foregoing description, in accordance with the teachings of the invention, a transistor switching circuit is provided in which the supply of current from a power source to a load is controlled by a main current carrying transistor (QA), which is in turn controlled by a control stage. The control stage includes a pair of complementary transistors operable to be in conduction or in an ON state when the current gain product thereof is unity or greater and in a nonconductive state or OFF state when the current gain product is less than unity. ON and OFF control pulses, suppliable from either separate pulse sources or a single source, are used to increase or decrease the product of the current gains of the two transistors to above or below unity.

Figure 4:
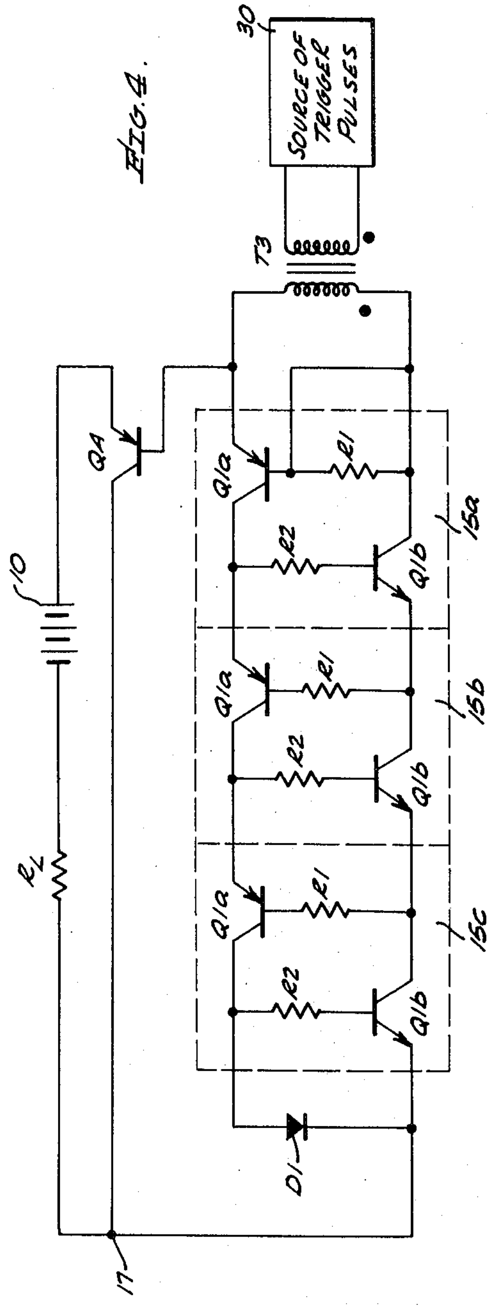
FIG. 4 is a schematic diagram of a multicontrol stage embodiment of the invention.

Although in the foregoing description, a single pair of complementary transistors is shown to control a single main current carrying transistor, in some applications due to higher voltage ratings of the main current carrying transistor and lower voltage ratings of the complementary transistors, it may be desirable to use a plurality of pairs of complementary transistors to control the single main current carrying transistor, and thereby distribute the voltage thereacross over a large number of transistors. One such arrangement is shown in FIG. 4 to which reference is made herein. Therein, instead of a single control stage 15, three identical control stages, designated **15*a*, 15*b*, and 15*c* are shown connected in series across terminals 16 and 17 to which the base and collector of the transistor QA are connected. The elements in each stage are designated by like numerals. The series connection of the stages is provided by connecting (when moving from point 16 towards point 17**) the collector of Q1*a* and emitter of Q1*b* of each stage, such as stage **15*a***, to the emitter of Q1*a* and collector of Q1*b* of an adjacent stage, such as stage **15*b*. A diode D1 is shown connected across the last stage 15*c* while transformer T3 couples the trigger pulse source 30** to the emitter and base of Q1*a* of the first stage **15*a***.

Briefly, by controlling the state of conduction of stage **15*a* in a manner as herebefore described, the state of conduction of the other stages (15*a* and 15*c*) are also controlled through the common base to emitter coupling of adjacent transistor stages. For example, when stage 15*a*** is supplied with an ON trigger pulse, the stage is switched to an ON state in which Q1*b* is in a conductive state. The conduction of the base current of Q1*b* establishes a voltage difference between its base and emitter of a polarity that the emitter to base voltage of Q1*a* of stage **15*b*** increases. As a result, the gain of Q1*a* of **15*b* increases, switching stage 15*b* to an ON state, which in turn switches stage 15*c* to an ON state. Thus by switching stage 15*a* to an ON state, the other stages are similarly switched to an ON state. On the other hand, an OFF pulse from source 30 switches stage 15*a* to an OFF state, which in turn drives the other stages to OFF states. Thus, single trigger pulses are needed to control the states of all the stages. A single ON trigger pulse is sufficient to drive stage 15*a* and thereby all the other stages to an ON state, while a single OFF trigger pulse drives stages 15*a*** and consequently the other stages to an OFF state.

The state interdependence of the stages may be summarized by again considering the base to emitter voltages of transistors Q1*b* and Q1*a* of stages **15*a* and 15*b* respectively. When an ON trigger pulse is supplied by source 30** to Q1*a* of stage **15*a*** driving it and Q1*b* of **15*a*** to an ON state, the base to emitter voltage of Q1*b* of **15*a*** increases which in turn increases the base to emitter voltage of Q1*a* of **15*b***. This increased voltage causes Q1*a* of **15*b*** to conduct, driving it and its complementary transistor (Q1*b* of **15*b*) to an ON state, which in turn drive the transistors in the next stage 15*c* to an ON state. Thus, all the stages are driven to an ON state. A similar chain reaction occurs when an OFF trigger pulse is supplied to stage 15*a***, switching it to an OFF state which results in the reduction of the base to emitter voltage of Q1*b* of **15*a***. This in turn reduces the base current of Q1*a* of **15*b*, resulting in the switching of transistors of 15*b* and subsequently the transistors of 15*c* to OFF states. The effect of the state of one stage on the others occurs in an extremely short interval so that from a practical point of view, all the stages may be thought of as being in one state or the other. This may be represented by the straight leading and trailing edges of pulse 25** in FIG. 2.

From the foregoing, it is thus seen that even though more than one stage of complementary transistor pairs are used to control the single main current carrying transistor QA, only single ON or OFF trigger pulses are required to switch all the stages to either an ON state or an OFF state, respectively. Although in FIG. 4 only three stages are serially interconnected, it should be appreciated that any number of stages may be employed to control the resistance between the base and collector of transistor QA, thereby controlling its state of conduction which in turn controls the current supplied to the load $R_L$, such as the current pulse 25 (FIG. 2) supplied during the interval between ON pulse 21 and OFF pulse 22.

Figure 5:
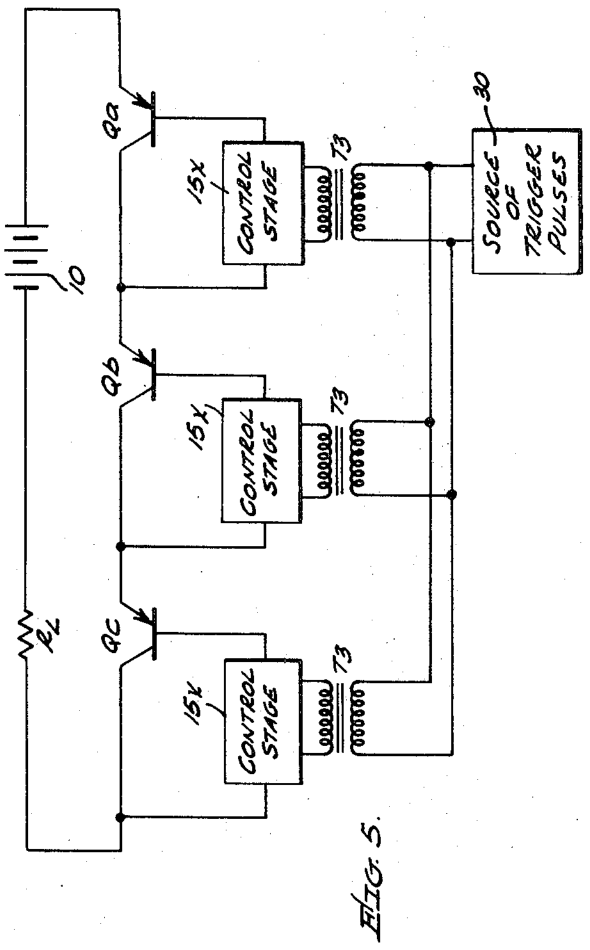
FIG. 5 is a block diagram of an embodiment of the invention which includes a plurality of main current carrying transistors.

In certain applications, it may be necessary or desirable to control the flow of current from the power source 10 to the load $R_L$ through a series of main current carrying transistors, rather than a single one, (QA) as shown in FIGS. 1 and 3. This is particularly the case where the power source voltage is higher than the maximum voltage rating of available transistors. In such an application, the switching circuit of the present invention may include a plurality of main current carrying transistors such as three, designated QA, QB and QC, in FIG. 5, to which reference is made herein. The transistors are shown connected across the power source 10 and the load $R_L$. A separate identical control stage **15*x* which is assumed to include one or more complementary pairs of transistors is connected between the base and collector of each main current carrying transistor and coupled to the source of trigger pulses 30 (FIG. 3) through a separate coupling transformer T3**.

By supplying an ON pulse from source 30, the transistors in each control stage 15$x$ are switched to an ON state providing a low resistance between the base and collector of the power transistor to which they are connected. Thus, the power transistors are switched to an ON state, enabling current to flow therethrough from the source 10 to the load $R_L$. The flow of current is terminated by applying an OFF pulse to each stage 15$x$ which switches the transistors therein to an OFF state, which in turn drives the power transistor with which it is connected to a nonconductive or OFF state. It should be appreciated that the single source 30 shown in FIG. 5 may be replaced by two separate sources such as 18 and 19 (see FIG. 1) which separately supply ON and OFF pulses, respectively. In such a case, each stage 15$x$ is supplied with two separate coupling transformers such as T1 and T2 (FIG. 1) through which the ON and OFF pulses respectively may be supplied thereto.

In order to reduce the number of coupling networks or transformers necessary to control the stages which in turn control the main current carrying transistors, in another embodiment of the invention, a group of serially interconnected control stages are employed to control all the main current carrying transistors. All the serially interconnected control stages are switched to an ON state by controlling one of them to be in an ON state, while by controlling the same or another stage to switch to an OFF state, all the stages are similarly switched to the OFF state. Thus, the number of required coupling networks is reduced.

Figure 6:
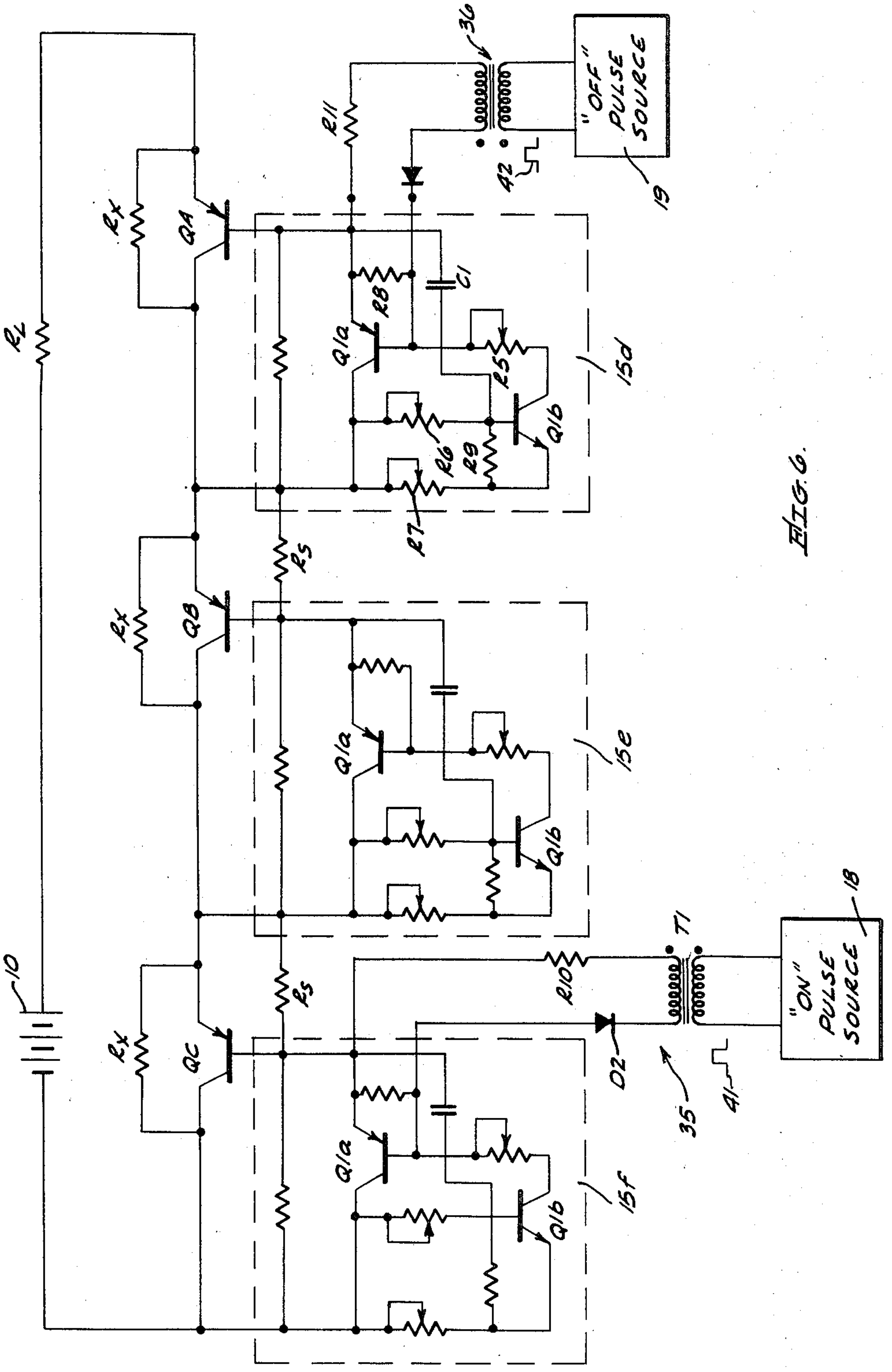
FIG. 6 is a schematic diagram of one embodiment of the invention including a plurality of main current carrying transistors.

Such an embodiment is shown in FIG. 6 in which elements like those shown in the foregoing figures are designated by like numerals. Transistors QA, QB, and QC are shown connected across the source 10 and load $R_L$, with each transistor being shunted by a shunt resistor $R_X$, connected across the emitter and collector thereof. Three identical control stages, designated 15$d$, 15$e$, and 15$f$ are shown connected in series by means of two series resistors $R_S$. Each control stage is connected across the base and collector of a different main current carrying transistor.

Each control stage is similar to stage 15 shown in FIGS. 1 and 3, in that it includes a pair of complementary transistors Q1$a$ and Q1$b$. Each stage also includes resistors R5, R6, and R7 which are analogous to resistors R1, R2 and R3 respectively, of FIG. 1, except for being of the variable type. Also, the stage includes resistors R8 and R9 connected across the base and emitter of Q1$a$ and Q1$b$ respectively, and a capacitor C1 between the emitter of Q1$a$ and base of Q1$b$. In FIG. 6, the arrangement is diagrammed whereby ON and OFF pulses are supplied from separate sources 18 and 19 respectively, each coupled through a separate coupling network to a different control stage. Source 18 is coupled by a coupling network 35 to the base and emitter of Q1$a$ in stage 15$f$, while network 36 couples source 19 to Q1$a$ of stage 15$d$.

Network 35 includes transformer T1 and a resistor R10 connected together with a diode D2 in series with the secondary of T1 across the base and emitter of Q1$a$ of stage 15$f$, while a similar resistor R11 and a diode D3 are connected in series with the secondary of transformer T2 across the base and emitter of Q1$a$ of 15$d$. T2, R11, and D3 form coupling network 36. The polarities of D2 and D3 are chosen so as to prevent pulses with undesired polarities from affecting the control stages.

From the foregoing, it should be apparent that by supplying an ON pulse from source 18 such as pulse 41, the base to emitter voltage of Q1$a$ is increased so that stage 15$f$ is switched to conduction or to an ON state. This in turn switches 15$e$ and 15$d$ to ON states. As a result, QA, QB and QC conduct and current is supplied to load $R_L$ through the three power transistors. Then, when an OFF pulse, such as pulse 42, is supplied by source 19, the base current of Q1$a$ in 15$d$ is reduced so that the current gain product of Q1$a$ and Q1$b$ in 15$d$ is less than unity. As a result, stage 15$d$ is driven to an OFF state, which in turn drives stages 15$e$ and 15$f$ to OFF states. This causes each of the transistors QA, QB, and QC to be driven to an OFF state and thereby terminate the current flow through the three transistors to load $R_L$.

The effect of the state of one of the stages diagrammed in FIG. 6 on the states of the other stages is achieved by means of displacement currents. That is, when stage 15$f$ is switched to an ON state so that the voltage drop thereacross is negligible, the voltages across the remaining stages increases, causing displacement currents to flow in the various transistors of 15$d$ and 15$e$. These currents are in directions which forward bias the base to emitter junctions of the transistors causing all of them to change to the ON state. On the other hand, when stage 15$d$ is switched to the OFF state, the voltage across stage 15$d$ increases causing displacement currents to flow in capacitors C1 in such a direction as to reverse bias the base to emitter junctions of the transistors in stages 15$e$ and 15$f$, switching the transistors to their OFF state.

It should be pointed out that although in FIG. 4 the single main current carrying transistor QA is shown controlled by three stages 15$a$, 15$b$ and 15$c$ which are directly coupled to one another, i.e. the base to emitter junction of Q1$b$ of 15$a$ is across the emitter to base junction of Q1$a$ of 15$b$, a multicontrol stage arrangement such as shown in FIG. 6 may be employed to control QA. That is, stages 15$d$, 15$e$, and 15$f$ (FIG. 6) connected by series resistors $R_S$ may be used to control a single transistor. Also either series arrangement of a plurality of control stages, such as 15$a$, 15$b$, and 15$c$ in FIG. 4 or 15$d$, 15$e$, and 15$f$ of FIG. 6, may be employed to control each of a plurality of main current carrying transistors. Thus, for example, a series arrangement such as three stages 15$d$, 15$e$ and 15$f$ may be used to control each of transistors QA, QB and QC. Therefore, in FIG. 5, each control stage 15$x$ may be generalized to include more than one control stage, connected either as shown in FIG. 4 or in FIG. 6.

Figure 7:
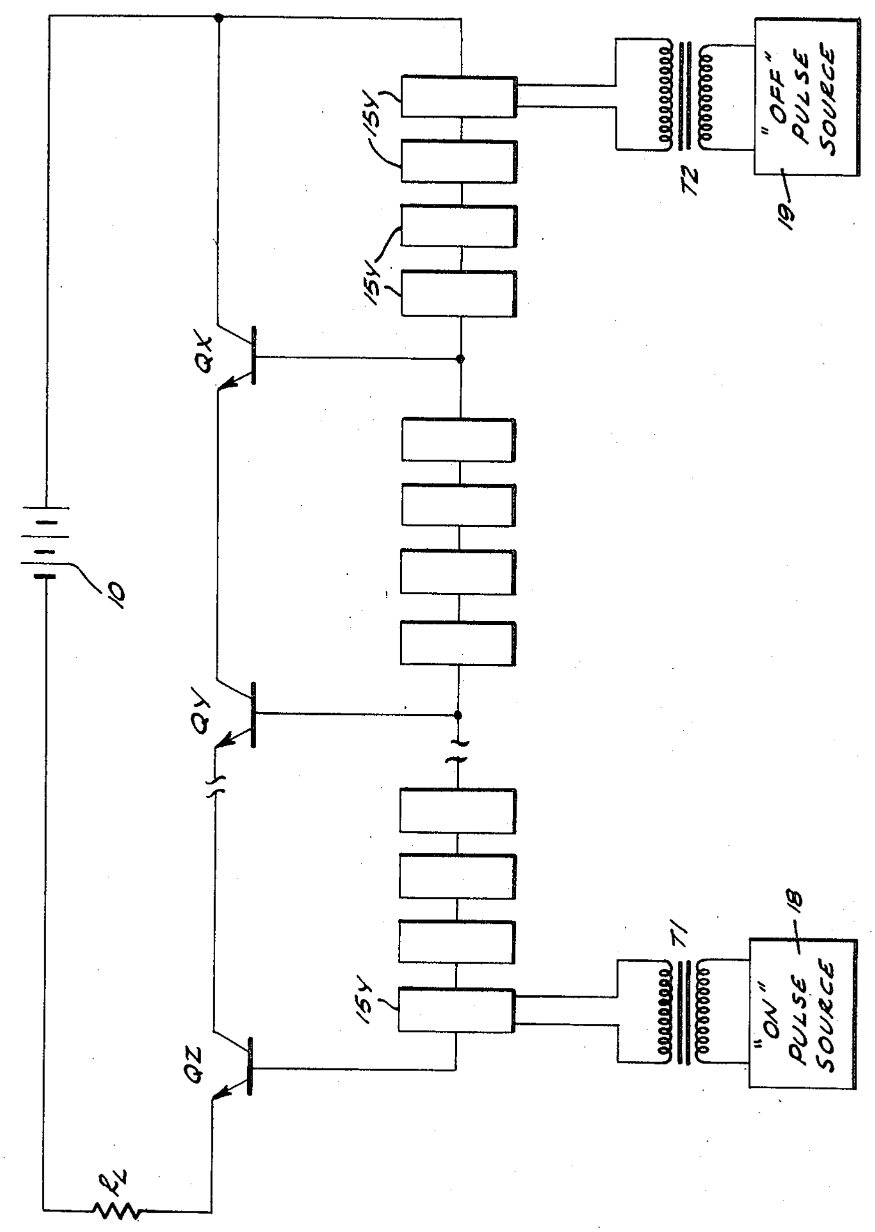
FIG. 7 is a generalized block diagram in which the transistor switching circuit of the invention includes a plurality of main current carrying transistors, each controlled by a plurality of control stages.

Reference is now made to FIG. 7 in which such an arrangement is diagrammed. Therein, load $R_L$ is connected to power source 10 through serially connected main current carrying transistors QX, QY and QZ, which for purposes of generalization are NPN transistors rather than of the PNP type herebefore diagrammed. The base to collector resistance of each transistor is controlled by four control stages, all designated 15$y$. Each stage 15$y$ is similar to the control stages herebefore described in that it includes the pair of complementary transistors connected in a regenerative closed loop. The stages 15$y$ may be interconnected as shown in FIG. 4, or as shown in FIG. 6 with resistors $R_S$ between stages. A single ON pulse from source 18 is sufficient to switch all the stages 15$y$ to an ON state and thereby switch all the main current carrying transistors QX, QY and QZ to a conductive state, while a single OFF pulse from source 19 switches all the transistors to an OFF state. Thus the current to load $R_L$ from source 10 is controllable by single ON and OFF pulses.

There has accordingly been shown and described herein a novel transistor switching circuit. The circuit may include one or more power transistors each of voltage and current ratings dependent on the power source and load between which power is switched. The main current carrying transistor need not be of the type which has a complementary type transistor. Also, its forward current gain $\beta$, may be less than unity. Each main current carrying transistor is controllable by one or more pairs of complementary transistors of lower voltage ratings. Each pair of complementary transistors, defining a stage, is connected in a regenerative closed loop arrangement to be in a conductive or nonconductive state. The voltage and current ratings of the transistor in each pair may be lower than those of the main current carrying transistor associated therewith. A plurality of stages may be connected in series with any desired number, but not less than one, coupled to control each of a plurality of main current carrying transistors. Single ON and OFF pulses are needed to switch all the transistors in all the stages and the power transistor to ON and OFF states respectively. Thus, all the transistors are either in an ON or conductive state or in an OFF nonconductive state.

It is appreciated that those familiar with the art may make modifications in the arrangements as shown without departing from the spirit of the invention. Therefore, all such modifications and/or equivalents are deemed to fall within the scope of the invention as defined in the appended claims.

What is claimed is:

1. A transistor switching circuit of the type including a control transistor having a base, a collector and an emitter, for controlling the flow of current from a current source to a current load as a function of the state of conduction of said control transistor, the improvement comprising:

a control stage coupled to said control transistor to control the conduction thereof, said control stage including a plurality of pairs of complementary transistors, each of the transistors of each pair of complementary transistors including a base, a collector and an emitter, and having preselected current gain characteristics;

means connecting the base and collector of one of the transistors in each of said pairs to the collector and base respectively of the other transistor of said pair;

means for serially connecting said plurality of pairs to form a series of pairs, means for connecting the serially connected pairs across the base and collector of said control transistor;

coupling means coupled to one of the transistors of said pairs of transistors and adapted to receive control trigger pulses to control the state of conduction of said pairs of complementary transistors and thereby control the state of conduction of said control transistor, said coupling means including at least one coupling network adapted to receive a first trigger pulse for switching the plurality of pairs of transistors to a conductive state thereby providing a low resistance across the base and collector of said control transistor, said coupling network being further adapted to receive a second trigger pulse for switching the plurality of pairs of transistors to a nonconductive state to provide a relatively high resistance between the base and collector of said control transistor.

2. The improvement as recited in claim 1 wherein each pair of complementary transistors comprises a PNP transistor and a complementary NPN transistor interconnected whereby said pair of transistors are in a conductive state when the product of the current gains thereof is not less than unity and in a nonconductive state when the product of the current gains thereof is below unity, said pairs being interconnected in series whereby all the pairs are switched to a conductive state when one of the pairs is switched to a conductive state in response to the first trigger pulse received by said coupling means, all the pairs being switched to a nonconductive state when one of the pairs is switched to a nonconductive state in response to the second trigger pulse received by said coupling means.

3. A transistor switching circuit for controlling the supply of current from a source to a current load with which said circuit is connected in series, comprising:

a plurality of current carrying transistors connected in series to form a sequence of transistors, each transistor having a base, a collector, and an emitter, the emitter of each intermediate transistor in said sequence connected to the collector of an adjacent transistor in said sequence;

a control stage coupled between the base and collector of each current carrying transistor to control the state of conduction thereof, each control stage including at least one pair of complementary transistors, each transistor in said pair having preselected current gain characteristics, an emitter, a collector and a base, means connecting the base and collector of one of said transistors in said pair to the collector and base respectively of the other transistor in the pair to form a closed regenerative loop whereby the pair of transistors is in a conductive state when the product of the current gains thereof is not less than unity and in a nonconductive state when the product of the current gains is less than unity; and control means coupled to at least one transistor of one of said pairs for controlling the state of conduction of the pairs of transistors, thereby controlling the states of conduction of each of said plurality of current carrying transistors.

4. The transistor switching circuit as recited in claim 3 wherein the control stage connected between the base and emitter of each current carrying transistor includes a plurality of serially interconnected pairs of transistors forming regenerative closed loops, whereby each pair of transistors is switched to its conductive state when the transistors in one pair are switched to a conductive state, and the transistors in all the pairs are switched to a nonconductive state when the transistors of one of said pairs are switched to a nonconductive state.

5. The transistor switching circuit as recited in claim 4 wherein the pairs of transistors of each control stage which are connected in series are serially connected with the pairs of transistors of other control stages to form a series of interconnected pairs of transistors, said control means including means coupled to at least one transistor in one of said pairs to control the current gain thereof and thereby control the state of conduction of the pair thereof, and the other pairs of transistors connected in series therewith.

6. The transistor switching circuit as recited in claim 5 in which said control means includes a first control network coupled to one transistor in one of said pairs so as to increase the current gain thereof in response to an ON signal applied to said first control network, and a second control network coupled to one transistor of another pair of transistors so as to decrease the current gain of the transistor and thereby decrease the product of the current gain of the transistor and the complementary transistor thereof to below unity, in response to an OFF signal applied to said second control network.

References Cited

UNITED STATES PATENTS

| | | | |
|---|---|---|---|
| 2,907,895 | 10/1959 | Van Overbeek | 307—288 |
| 2,963,692 | 12/1960 | Barter et al. | 307—288 X |
| 3,157,797 | 11/1964 | Eshelman | 307—255 X |

DONALD D. FORRER, Primary Examiner

U.S. Cl. X.R.

307—253, 255, 288, 313